(12) United States Patent
Kim

(10) Patent No.: US 7,160,783 B2
(45) Date of Patent: Jan. 9, 2007

(54) MOS TRANSISTOR AND METHOD OF MANUFACTURING THE SAME

(75) Inventor: Hak-Dong Kim, Suwon (KR)

(73) Assignee: Dongbu Electronics Co., Ltd., Seoul (KR)

(*) Notice: Subject to any disclaimer, the term of this patent is extended or adjusted under 35 U.S.C. 154(b) by 0 days.

(21) Appl. No.: 11/023,104

(22) Filed: Dec. 27, 2004

(65) Prior Publication Data

US 2005/0139911 A1    Jun. 30, 2005

(30) Foreign Application Priority Data

Dec. 27, 2003   (KR)  .................... 10-2003-0098381

(51) Int. Cl.
*H01L 21/336* (2006.01)
*H01L 29/76* (2006.01)

(52) U.S. Cl. .................. 438/301; 438/302; 438/303; 438/305; 438/306; 257/327; 257/345

(58) Field of Classification Search ........ 438/301–306; 257/327, 344, 345, 336
See application file for complete search history.

(56) References Cited

U.S. PATENT DOCUMENTS 5,320,974 A * 6/1994 Hori et al. .................. 438/302

6,690,060 B1 * 2/2004 Horiuchi et al. ............ 257/327

FOREIGN PATENT DOCUMENTS

JP         62051216     *    3/1987

* cited by examiner

*Primary Examiner*—Hsien-Ming Lee
(74) *Attorney, Agent, or Firm*—Andrew D. Fortney

(57) ABSTRACT

A metal oxide semiconductor (MOS) transistor and a method of manufacturing the same are disclosed. An example MOS transistor includes a semiconductor substrate of a first conductivity type where an active region is defined, a gate insulating layer pattern and a gate formed on the active region of the substrate, a spacer formed on side walls of the gate, and source/drain extension regions of a second conductivity type formed within the substrate at both sides of the gate. The example MOS transistor further includes source/drain regions of the second conductivity type formed within the substrate at both side of the spacer and punch-through suppression regions of the first conductivity type formed within the active of the substrate. The punch-through suppression regions surround the source/drain extension regions and the source/drain regions under the gate.

9 Claims, 5 Drawing Sheets

MOS TRANSISTOR AND METHOD OF MANUFACTURING THE SAME

TECHNICAL FIELD

The present disclosure relates to a semiconductor device, and more particularly, to a metal oxide semiconductor (MOS) transistor and a method of manufacturing the same.

BACKGROUND

FIGS. 1A to 1E are cross-sectional views depicting a known method of manufacturing a p-type MOS transistor. Referring to FIG. 1A, an active region where a MOS transistor is to be formed is defined by forming an isolation layer 110 in an n-type semiconductor substrate 100. Alternatively, instead of the n-type semiconductor substrate 100, a p-type semiconductor substrate may be used. In this case, an n-type well region is formed in the p-type semiconductor substrate. Next, a gate insulating layer pattern 120 and a gate 130 are subsequently formed on the active region of the substrate 100. The active region under the gate 130 substantially serves as a channel region.

Referring to FIG. 1B, to reduce the short channel effect, halo impurity regions 141 are formed in a vicinity of the channel region under the gate 130 by implanting n-type impurities in a tilted direction (the direction of the arrow) with respect to the substrate 100 with a first ion implanting process.

Referring to FIG. 1C, source/drain extension regions 142, that is, lightly doped drain (LDD) regions are formed within the substrate at both sides of the gate 130 by implanting lightly doped p-type impurities in a vertical direction (the direction of the arrow) with respect to the substrate 100 with a second ion implanting process. In some cases, the second ion implanting process may be performed prior to the first ion implanting process. In addition, although not shown in the figure, an oxide layer may be formed as an ion implanting buffer layer on the surface of the substrate 100 prior to performing the second ion implanting process.

Referring to FIG. 1D, gate spacer 150 is formed on both side walls of the gate 130. Next, source/drain regions 143 are formed within the substrate 100 at both sides of the spacer 150 by implanting heavily doped p-type impurities in a vertical direction (the direction of the arrows) with respect to the substrate 100 with a third ion implanting process.

Referring to FIG. 1E, a general silicide process is performed to form metal silicide layers 160 on the source/drain regions 143 and the gate 130.

In the known method of manufacturing a conventional p-type MOS transistor, boron (B) ions have been used as impurities for the third ion implanting process for forming the source/drain regions 143. In addition, after the B ions are implanted, the implanted B ions are diffused by performing a thermal treatment process. However, because it is difficult to effectively control a transient enhanced diffusion (TED) in which the implanted B ions are rapidly diffused during the thermal treatment process, there is a problem in that a threshold voltage is too sharply lowered. In addition, there is another problem in that a short channel effect (SCE) that a punch-through is so easily generated may increase.

Approaches for using halo impurity regions 141 or pocket regions to suppress the short channel effect have been proposed. However, as devices become more highly integrated, the short channel effect becomes more predominant. Therefore, these approaches have a limitation in suppressing the short channel effect.

DETAILED DESCRIPTION

In general, the example methods and apparatus described herein provide a MOS transistor capable of effectively suppressing a short channel effect. An example MOS transistor includes: a semiconductor substrate of a first conductivity type where an active region is defined; a gate insulating layer pattern and a gate formed on the active region of the substrate; a spacer formed on side walls of the gate; source/drain extension regions of a second conductivity type formed within the substrate at both sides of the gate; source/drain regions of the second conductivity type formed within the substrate at both side of the spacer; and punch-through suppression regions of the first conductivity type formed within the active of the substrate, the punch-through suppression regions surrounding the source/drain extension regions and the source/drain regions under the gate.

An example method of manufacturing a MOS transistor subsequently forms a gate insulating layer and a gate conductive layer on a semiconductor substrate of a first conductivity type where an active region is defined by an isolation layer; implants first impurities of the first conductivity type within the active region of the substrate by performing a first ion implanting process; forms a gate and a gate insulating layer pattern on the active region of the substrate by patterning the gate insulating layer and the gate conductive layer; implants second impurities of a second conductivity type within the substrate at both sides of the gate by performing a second ion implanting process; implants third impurities of the first conductivity type within the substrate under the edge of the gate by performing a third ion implanting process; forms a spacer on side walls of the gate; forms a first punch-through suppression region containing the first impurities, source/drain extension regions containing the second impurities, and a second punch-through suppression region containing the third impurities by performing a first thermal treatment process; implants fourth impurities of the second conductivity type within the substrate at both sides of the spacer by performing a fourth ion implanting process; and forms source/drain regions containing the fourth impurities by performing a second thermal treatment process.

Figure 1A:
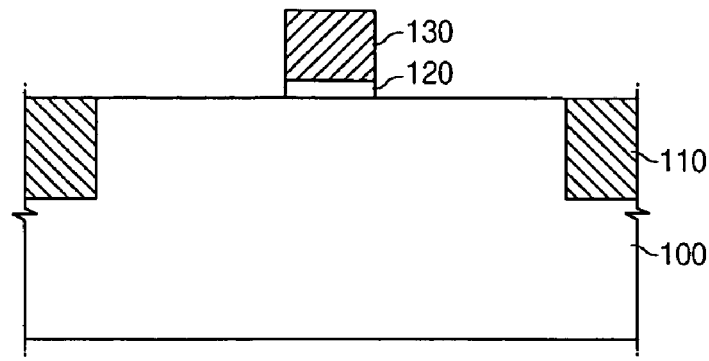
FIGS. 1A to 1E are cross-sectional views depicting a known method of manufacturing a p-type MOS transistor.
Figure 1B:
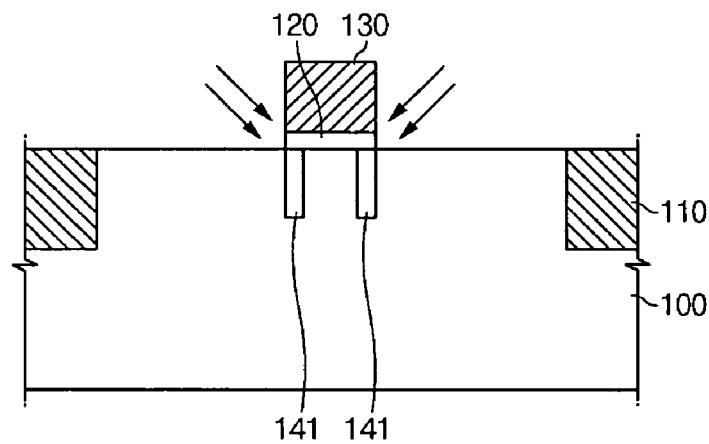
Figure 1C:
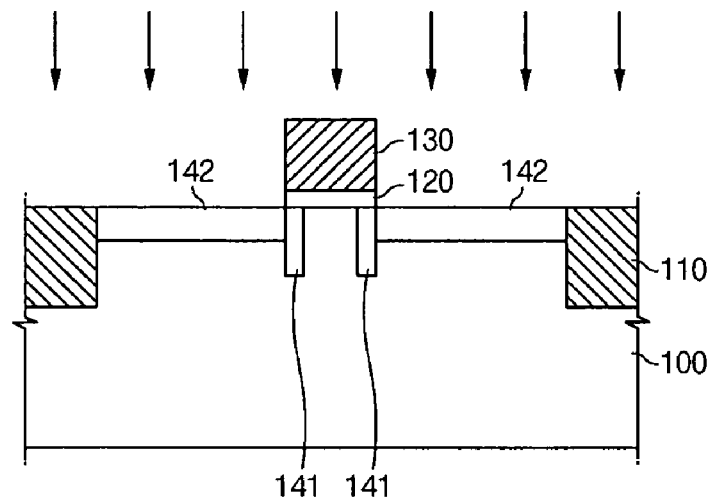
Figure 1D:
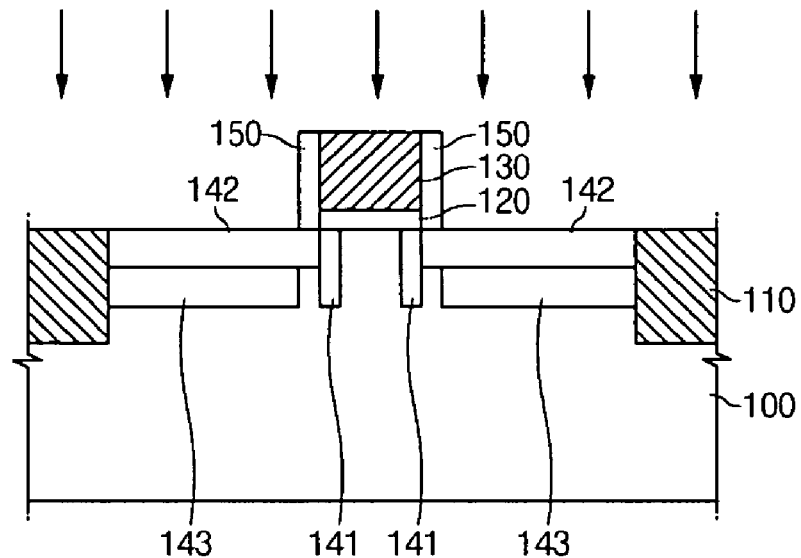
Figure 1E:
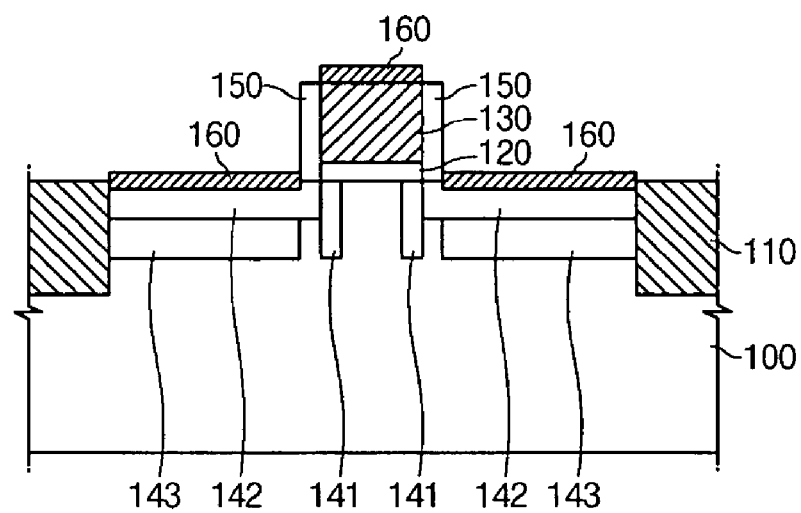
Figure 2A:
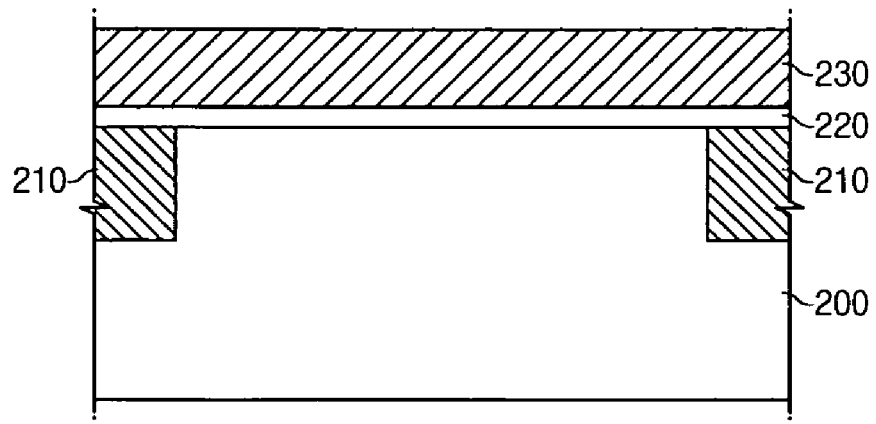
FIGS. 2A to 2F are cross sectional views depicting an example method of manufacturing a p-type MOS transistor.

FIGS. 2A to 2F are cross sectional views depicting an example method of manufacturing a p-type MOS transistor. Referring to FIG. 2A, a gate insulating layer 220 and a gate conductive layer 230 are subsequently formed on a semiconductor substrate 200 where an active region is defined by an isolation layer 210. The gate insulating layer 220 is formed of an oxide layer and the gate conductive layer 230 is formed of a polysilicon layer.

Figure 2B:
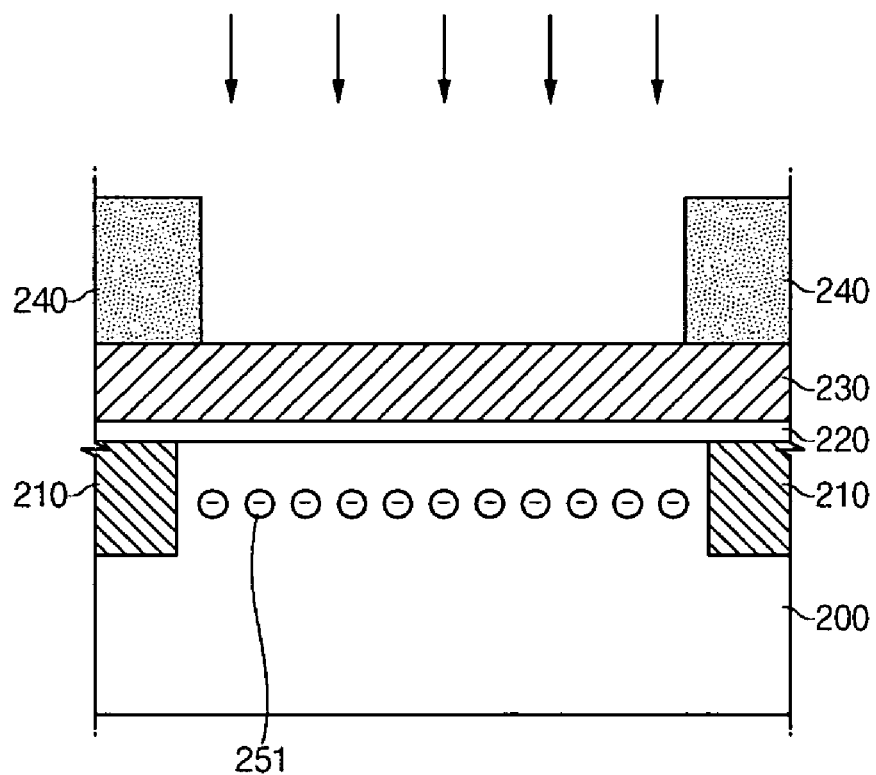

Referring to FIG. 2B, a mask pattern 240 is formed to expose a portion of a surface of the gate conductive layer 230 corresponding to the active region of the substrate 200. The mask pattern 240 is formed of a photoresist pattern by a photolithography process. Next, to suppress occurrence of punch-through, first n-type impurities 251 are implanted within the active region of the substrate 200 by performing a first ion implanting process in a vertical direction (the direction of the arrows) with respect to the substrate 200 using the mask pattern 240 as a ion implanting mask. Here, the first ion implanting process is performed at an implanting energy of about 10 to 70 keV and a concentration of $1\times10^{13}$ to $1\times10^{14}$ ions/cm2 using phosphorus (P) ions as the first n-type impurities 251.

Figure 2C:
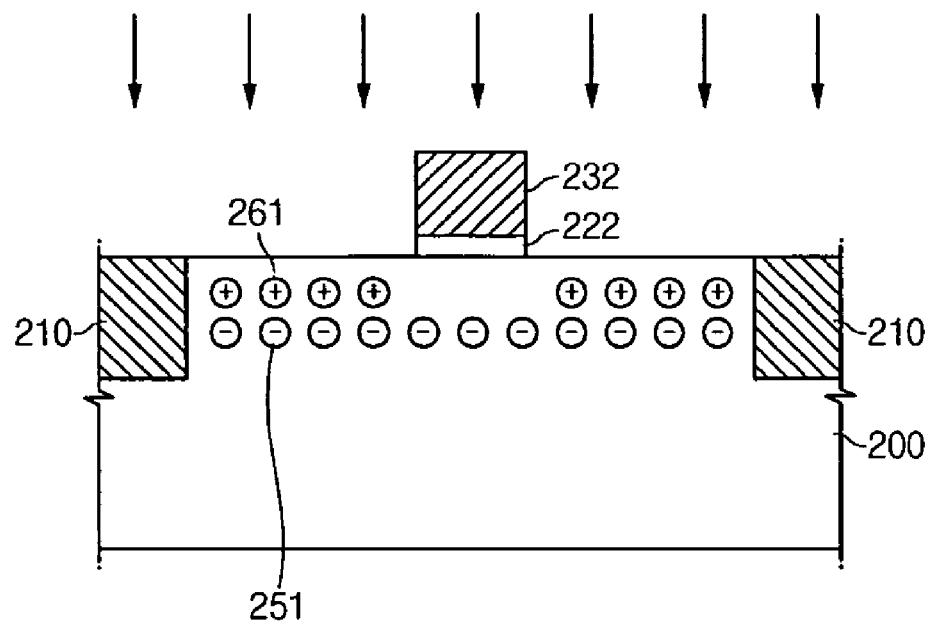

Referring to FIG. 2C, the mask pattern 240 (see FIG. 2B) is removed by a well-known method. Then, a gate 232 and a gate insulating pattern 222 are formed by subsequently patterning the gate conductive layer 230 and the gate insulating layer 220 (see FIG. 2B). Although not shown in the figure, to recover etching damage during the patterning process, an oxide layer having a thickness of 30 to 60 Å may be formed on the entire surface of the substrate 200.

Next, lightly doped first p-type impurities 261 for forming source/drain extension regions, that is, LDD regions are implanted within the substrate 200 at both sides of the gate 232 by performing a second ion implanting process in a vertical direction (the direction of the arrows) with respect to the substrate 200. Here, the second ion implanting process is performed at an implanting energy of about 3 to 50 keV and a concentration of $1\times10^{14}$ to $5\times10^{14}$ ions/cm2 using BF2 ions as the first p-type impurities 261.

Figure 2D:
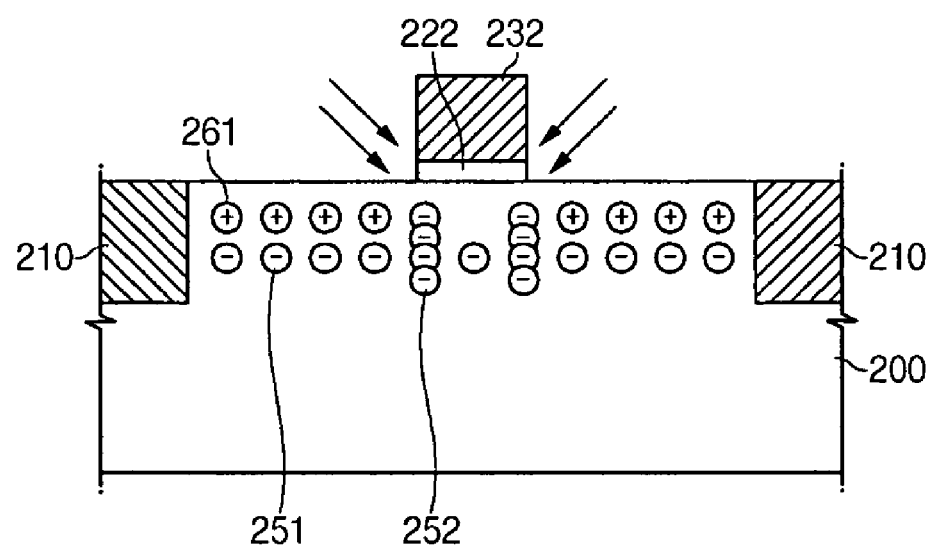

Referring to FIG. 2D, to suppress occurrence of punch-through, second n-type impurities 252 are implanted in the substrate 200 under the edge of the gate 232 by performing a third ion implanting process in a tilted direction (the direction of the arrows) with respect to the substrate 200. Here, the third ion implanting process is performed at an implanting energy of about 20 to 80 keV and a concentration of $1\times10^{14}$ to $5\times10^{14}$ ions/cm2 using arsenic (As) ions as the second n-type impurities 252. In particular, the tilt angle is controlled to 20 to 30 degree.

Figure 2E:
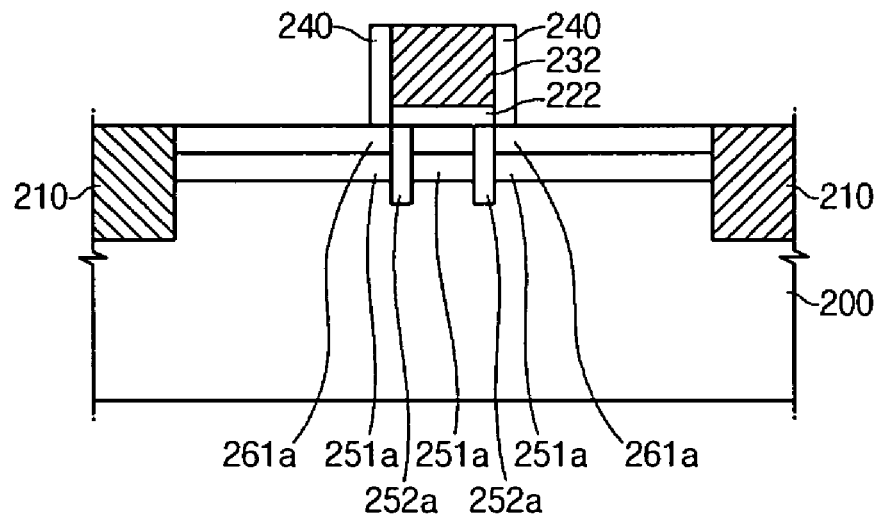

Referring to FIG. 2E, gate spacer 240 is formed on side walls of the gate 232 by a general spacer forming process. Here, the spacer forming process includes depositing an insulating layer such as a nitride layer having a thickness of about 600 to 2000 Å on the entire surface of the substrate 200 and etching the insulating layer by an anisotropic etching method such as an etch-back method. Next, the first and second n-type impurities 251 and 252 and the first p-type impurities 261 are diffused by performing a first thermal treatment process. As a result, first punch-through suppression regions 251a are formed within the active region of the substrate 200, source/drain extension regions 261a, that is, lightly doped drain (LDD) regions are formed within the substrate at both sides of the gate 232, and second punch-through suppression regions 252a are formed within the substrate 200 under the edge of the gate 232. Here, the first thermal treatment process is performed at a temperature of about 800 to 1000° C. in an $N_2$ ambient for 10 to 30 seconds by an RTP (rapid thermal process).

Figure 2F:
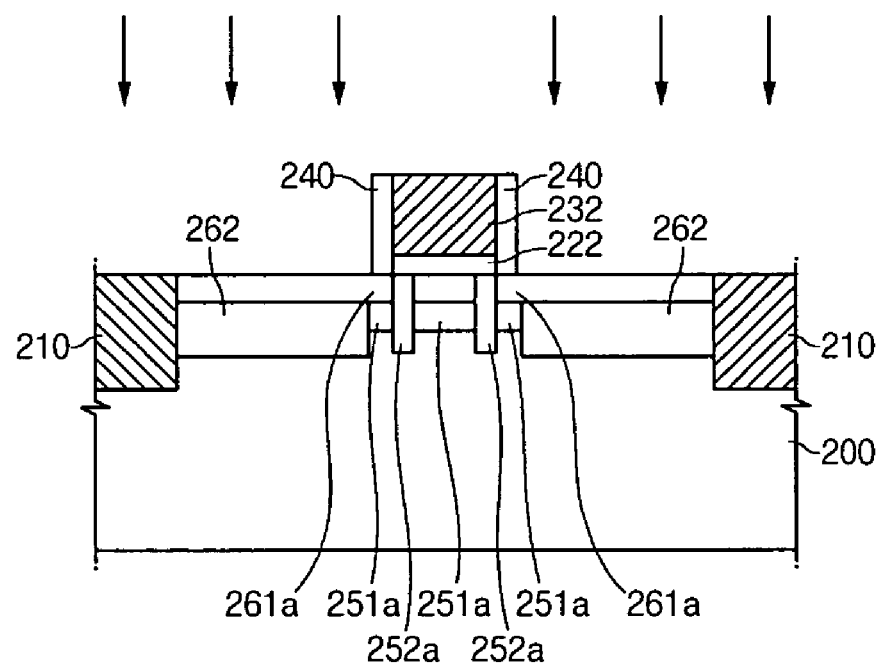

Referring to FIG. 2F, source/drain regions 262 are formed within the substrate 200 at both sides of the spacer 240 to be in contact with the LDD regions 252a by implanting heavily doped second p-type impurities 240 within the substrate 200 at both sides of the spacer 240 by performing a fourth ion implanting process in a vertical direction (the direction of the arrows) with respect to the substrate 200, and performing a second thermal treatment process. Here, the fourth ion implanting process is preformed at an implanting energy of about 3 to 40 keV and a concentration of $1\times10^{15}$ to $5\times10^{15}$ ions/cm2 using boron (B) ions. The second thermal treatment process is performed at a temperature of about 900 to 1050° C. in an $N_2$ ambient for 10 to 30 seconds by an RTP. Thereafter, a general metal silicide process and a metal interconnection line process are performed.

As shown in FIG. 2F, the LDD regions 261 and the source/drain regions 262 are surrounded by the first and second punch-through suppression regions 251a and 252a.

Therefore, the occurrence of the punch-though is effectively suppressed, so that the short channel effect of the MOS transistor can be suppressed.

On the other hand, although the p-channel MOS transistor is described in the aforementioned embodiment, the foregoing can be applied to form an n-channel MOS transistor in a similar manner.

While the examples herein have been described in detail with reference to example embodiments, it is to be understood that the coverage of this patent is not limited to the disclosed embodiments, but, on the contrary, is intended to cover various modifications and equivalent arrangements included within the sprit and scope of the appended claims.

What is claimed is:

1. A method of manufacturing a MOS transistor, comprising:
   subsequently forming a gate insulating layer and a gate conductive layer on a semiconductor substrate having a first conductivity type where an active region is defined by an isolation layer;
   implanting first impurities of the first conductivity type within the active region of the substrate by performing a first ion implanting process;
   forming a gate and a gate insulating layer pattern on the active region of the substrate by patterning the gate insulating layer and the gate conductive layer;
   implanting second impurities of a second conductivity type within the substrate at both sides of the gate by performing a second ion implanting process;
   implanting third impurities of the first conductivity type within the substrate under the edge of the gate by performing a third ion implanting process;
   forming a spacer on side walls at the gate;
   forming a first punch-through suppression region containing the first impurities, source/drain extension regions containing the second impurities, and a second punch-through suppression region containing the third impurities by performing a first thermal treatment process;
   implanting fourth impurities of the second conductivity type within the substrate at both sides at the spacer by performing a fourth ion implanting process; and
   forming source/drain regions containing the fourth impurities by performing a second thermal treatment process.

2. The method of claim 1, wherein the first conductivity type is n-type and the second conductivity type is p-type.

3. The method of claim 2, wherein the first ion implanting process is performed at an implanting energy of about 10 to 70 keV and a concentration of $1\times10^{13}$ to $1\times10^{14}$ ions/cm$^2$ using phosphorus (P) ions as the first impurities.

4. The method of claim 2, wherein the third ion implanting process is performed to a tilted direction with respect to the substrate.

5. The method of claim 4, wherein the third ion implanting process is performed at an implanting energy of about 20 to 80 keV and a concentration of $1\times10^{14}$ to $5\times10^{14}$ ions/cm$^2$ using arsenic (As) ions as the third impurities.

6. The method of claim 5, wherein the third ion implanting process is performed at a tilt angle of 20 to 30 degrees.

7. The method of claim 1, wherein the first thermal treatment process is performed at a temperature of about 800 to 1000° C. in an $N_2$ ambient for 10 to 30 seconds by an RTP.

8. The method of claim 1, wherein the second thermal treatment process is performed at a temperature of about 900 to 1050° C. in an $N_2$ ambient for 10 to 30 seconds by an RTP.

9. The method of claim 1, wherein the first conductivity type is p-type and the second conductivity type is n-type.

* * * * *